United States Patent [19]

Savariar-Hauck et al.

[11] Patent Number: 5,695,905

[45] Date of Patent: Dec. 9, 1997

[54] PHOTOSENSITIVE COMPOSITIONS AND LITHOGRAPHIC PRINTING PLATES UTILIZING OXAZOLINE MODIFIED ACID POLYMERS

[75] Inventors: Celin M. Savariar-Hauck, Badenhausen; Harald Baumann; Hans-Joachim Timpe, both of Osterode; Udo Dwars, Herzberg, all of Germany

[73] Assignee: Sun Chemical Corporation, Fort Lee, N.J.

[21] Appl. No.: 649,350

[22] Filed: May 17, 1996

[30] Foreign Application Priority Data

May 17, 1995 [DE] Germany .................. 195 18 118.2

[51] Int. Cl.[6] .................................................. G03F 7/021
[52] U.S. Cl. ...................... 430/162; 430/157; 430/175; 430/176; 430/273.1; 430/281.1
[58] Field of Search ................................. 430/175, 176, 430/281.1, 157, 162, 273.1

[56] References Cited

U.S. PATENT DOCUMENTS

| | | |
|---|---|---|
| 3,372,105 | 3/1968 | Johnson . |
| 3,732,106 | 5/1973 | Steppan et al. . |
| 4,123,276 | 10/1978 | Kwita et al. . |
| 4,177,073 | 12/1979 | Hata et al. ............... 430/188 |
| 4,304,832 | 12/1981 | Ohta et al. ............... 430/175 |
| 4,355,096 | 10/1982 | Walls ........................ 430/302 |
| 4,387,151 | 6/1983 | Bosse et al. .............. 430/175 |
| 4,511,640 | 4/1985 | Liu ............................ 430/157 |
| 4,618,562 | 10/1986 | Walls et al. .............. 430/157 |
| 4,631,245 | 12/1986 | Pawlowski ................ 430/175 |
| 4,687,727 | 8/1987 | Toyama et al. .......... 430/175 |
| 4,731,316 | 3/1988 | Tomiyasu et al. ....... 430/157 |
| 4,741,985 | 5/1988 | Aoai et al. ............... 430/175 |
| 4,774,161 | 9/1988 | Sekiya et al. ............ 430/175 |
| 4,840,868 | 6/1989 | Pawlowski et al. ..... 430/155 |
| 4,877,711 | 10/1989 | Aoai et al. ............... 430/176 |
| 4,940,646 | 7/1990 | Pawlowski ............... 430/175 |
| 4,950,582 | 8/1990 | Aoai et al. ............... 430/175 |
| 4,983,491 | 1/1991 | Aoai et al. ............... 430/175 |
| 5,143,813 | 9/1992 | Joerg ........................ 430/162 |
| 5,169,897 | 12/1992 | Walls ........................ 525/61 |
| 5,176,985 | 1/1993 | Seitz et al. ............... 430/284 |
| 5,187,040 | 2/1993 | Mueller-Hess et al. .. 430/157 |
| 5,206,113 | 4/1993 | Mueller-Hess et al. .. 430/270 |
| 5,219,699 | 6/1993 | Walls et al. .............. 430/156 |
| 5,238,772 | 8/1993 | Mueller-Hess et al. .. 430/175 |
| 5,260,161 | 11/1993 | Matsumura et al. ..... 430/161 |
| 5,352,563 | 10/1994 | Kawasaki et al. ....... 430/614 |
| 5,376,513 | 12/1994 | Mihayashi ................ 430/552 |
| 5,470,930 | 11/1995 | Toba et al. ............... 526/204 |

FOREIGN PATENT DOCUMENTS

| | | |
|---|---|---|
| 1 172 442 | 8/1984 | Canada . |
| 0 487 343 | 5/1992 | European Pat. Off. . |

OTHER PUBLICATIONS

H. Baumann, H.J. Timpe, "Chemical Aspects of Offset Printing" in Journal für praktische Chemie Chemiker–Zeitung [Journal for Chemists] 336 (1994) pp. 377–389.

T. G. Gant and A. I. Meyers, "The Chemistry of 2–Oxazolines (1985–Present)" in Tetrahedron vol. 50, No. 8 (1994) pp. 2297–2360.

Primary Examiner—Christopher G. Young
Attorney, Agent, or Firm—Sidney Persley

[57] ABSTRACT

A photosensitive composition having a photoreactive component, selected from a diazonium polycondensation product or a free radical polymerizable system of photoinitiators and unsaturated compounds or a hybrid system and a binder formed by reacting a carboxyl group containing a polymer of formula

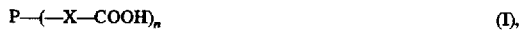

$$P \text{—} (\text{—} X \text{—} COOH)_n \quad (I),$$

wherein P is a polymer, n is an integer and X is a single bond or a spacer group, with a 2-oxazoline of the formula

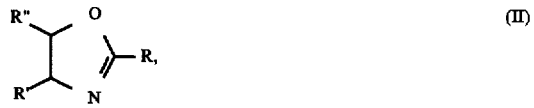

(II)

wherein R is an alkyl-, aryl-, aralkyl-, alkoxy-, aryloxy- or aralkyloxy group and R' and R" are independently a hydrogen, alkyl- or aryl groups.

13 Claims, No Drawings

5,695,905

PHOTOSENSITIVE COMPOSITIONS AND LITHOGRAPHIC PRINTING PLATES UTILIZING OXAZOLINE MODIFIED ACID POLYMERS

FIELD OF INVENTION

The present invention relates to photosensitive compositions which, inter alia, are extraordinarily suitable for preparing lithographic plates.

BACKGROUND OF THE INVENTION

Photosensitive compositions, particularly those used for high-performance lithographic plates, must fulfill high requirements. Improving the properties of photosensitive compositions and the corresponding lithographic plates essentially deals with two different approaches. One approach deals with the improvement of the properties of the photosensitive components in the mixtures (frequently diazo compounds, photo polymers etc.), the other deals with the search for novel polymeric compounds ("binders") which are to control the physical properties of the photosensitive layers. In particular the latter way is decisive for lithographic plates because the behavior in the developing and printing processes (such as developability, ink receptivity, scratch resistance, consistency in the number of prints produced) is decisively influenced by the polymer binders. Also shelf life and photosensitivity of the materials are strongly influenced by the polymeric compounds.

The polymeric binders therefore exhibit various structural elements for satisfying extensive requirements which may have different effects on individual properties. For instance, hydrophilic structural elements such as carboxyl groups, hydroxyl groups and the like generally promote the developability of the developers and partly ensure sufficient adhesion to polar substrates. Hydrophobic structural elements, on the other hand, reduce the capability of the photosensitive composition being developed in the above-mentioned developers, but ensure good ink receptivity typically required in the printing process, and which is indispensable in lithographic plates.

Due to the broad range of requirements regarding the polymeric binders, for many years there have been extensive studies on the synthesis and optimization of these substances for photosensitive compositions; e.g. H. Baumann and H. -J. Timpe, "Chemical Aspects Of Offset Printing" in J. prakt. Chem. Chemiker-Zeitung, Vol. 336, pgs. 377–89 (1994).

U.S. Pat. Nos. 4,511,640 and 4,618,562 and U.S. Pat. No. 4,731,316 describe binder systems consisting of mixtures of polymers having different hydrophilic and/or hydrophobic properties. However, such mixtures involve the frequent disadvantage that incompatibilities between the different substances lead to separation during the formation of layers. Furthermore, precipitation of the hydrophobic polymers during the developing process proved to lead to silting of the developing machines.

Copolymers consisting of only slightly hydrophilic monomers such as styrene, acrylic acid ester, methacrylic acid ester and the like, with hydrophilic comonomers are described in various publications. Examples of such comonomers are semi-esters of maleic acid described in Canadian Patent 1 172 442 and U.S. Pat. No. 4,687,727; itaconic acid described in U.S. Pat. No. 5,260,161; and acrylic acid and/or methacrylic acid described in European Patent A-487,343 and U.S. Pat. Nos. 4,304,832 and 4,123,276. The very tight inter-play of the properties important for use, layer adhesion, developability and printing ink receptivity, proved to be disadvantageous in such polymers. This causes unacceptable fluctuations of the polymers' properties due to the variations in polymer composition that can hardly be avoided in the production process.

U.S. Pat. No. 4,177,073 describes photosensitive compositions, wherein the binder is a reaction product of cellulose esters with cyclic, intramolecular acid anhydrides of dicarboxylic acids. These binders, however tend to render lithographic plate formulations too hydrophilic.

Partially acetalized polyvinyl alcohols were provided with groups soluble in alkalines by means of special reactions; see U.S. Pat. Nos. 4,387,151, 3,732,106, U.S. Pat. No. 3,372,105, U.S. Pat. Nos. 4,631,245 and 4,840,868, U.S. Pat. No. 4,741,985; U.S. Pat. No. 4,774,161, U.S. Pat. No. 5,169,897, U.S. Pat. No. 4,940,646, U.S. Pat. No. 5,143,813 and U.S. Pat. No. 5,219,699. However, the preparation of such binders involves considerable effort and is rather costly. Furthermore, the acetalization reactions result in a certain percentage of acetals having intermolecular bonds so that high-molecular gel particles are formed. These, in turn, cause undesirable effects in the coating process.

Polymers that contain urethane groups, also described as binders for photosensitive compositions are featured in U.S. Pat. Nos. 5,206,113, 5,238,772, 5,187,040 and 5,176,985, U.S. Pat. Nos. 4,983,491, 4,950,582 and 4,877,711. The necessary functionalization with hydrophilic groups, however, requires complex syntheses and involves high costs.

Despite this intensive research carried out in the

Despite this intensive research carried out in the field of photosensitive compositions for lithographic plates, there is still a need for improvement with existing mixtures, in particular in the area of photo sensitivity and the number of prints produced. Many of today's mixtures exhibit a high number of rather expensive components, which make their use uneconomical.

Thus, an object of the present invention is to provide photosensitive compositions that require as few components as possible (making them economically desirable vis-a-vis the mixtures described in the prior art) yet having the same or, in certain areas, improved properties. In particular, these properties include improved photosensitivity and printing ink receptivity and an increased number of prints possible from the corresponding lithographic plate.

Other objects and advantages of the invention will become apparent from the following description of embodiments.

SUMMARY OF THE INVENTION

The invention is a photosensitive composition comprising:

(a) a photo reactive component, selected from a diazonium polycondensation product, or a free radical polymerizable system of photo initiators and unsaturated compounds, or a hybrid system consisting of a diazonium polycondensation product and a free radical polymerizable system of photo initiators and unsaturated compounds; and (b) a binder; being the reaction product of a carboxyl group containing polymer of the formula

 (I), wherein

P is a polymer, n is an integer and

X is a single bond or a spacer group, with one or more different 2-oxazoline(s) of the formula

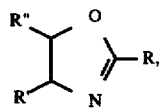 (II)

wherein R is selected from an alkyl, aryl, aralkyl, alkoxy, aryloxy or aralkyloxy group and R' and R" are independently selected from hydrogen, alkyl or aryl groups.

DESCRIPTION OF THE INVENTION

The surprising advantages of the invention are that by means of a rather simple synthesis, starting from inexpensive polymers available in large-scale, specific polymers can easily be prepared. The various possibilities surrounding the degree of reacted carboxyl groups, choice of 2-oxazoline substituents, as well as the choice of modifiable polymers, make it possible to exactly predetermine a broad range of polymer properties. This way of tailor-making polymers is well suited for a large variety of photocrosslink mechanisms. In addition, it turns out that the photosensitivity, chemical and mechanical properties of the photosensitive composition, for use in making offset lithographic plates, can be considerably improved.

The first essential component of the photosensitive compositions of the present invention is the reaction product of the a carboxyl-group containing polymer with one or more different 2-oxazolines which can easily be produced; see T. G. Gant and A. I. Meyers, "Tetrahedron 50", pgs. 2297–2360, (1994). Alkyl, aryl, aralkyl, alkoxy, aryloxy or aralkyloxy groups are suitable substituents in the 2-position of the oxazolines. Especially preferred are alkyl and aryl groups. The substituents R' and R" in the 4- and 5-positions of the 2-oxazolines may independently be hydrogen, alkyl or aryl groups. Hydrogen is especially preferred.

The alkyl and alkoxy groups preferably have 1 to 20 carbon atoms and preferably have 1 to 6 carbon atoms. The aryl and aryloxy groups preferably have 6 to 18, more preferably 6 to 12 carbon atoms. The alkyl and/or aryl portions in the aralkyl and aralkyloxy groups are as defined above.

Especially preferred are 2-oxazolines where R' and R" are hydrogen and R is a methyl, ethyl or phenyl group.

As for the carboxyl groups containing polymer of formula (I), reacted with 2-oxazolines, the carboxyl group is bound to the main chain either directly, where X is a single bond, or via a spacer group of the formula

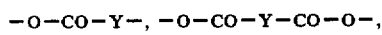

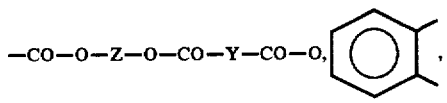

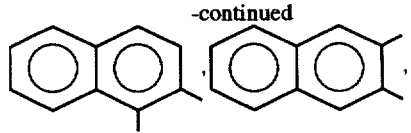

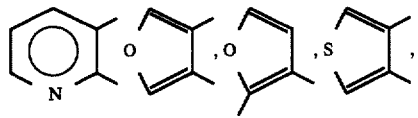

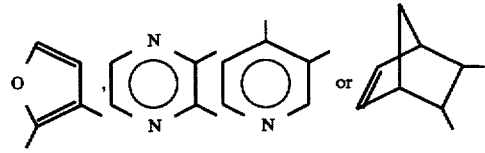

wherein Y is $-CR^1R^2CR^3R^4-$, $-CR^1=CR^2-$, and $R^1$ $R^2$ $R^3$, $R^4$ each independently are hydrogen or an alkyl and Z is $-(CH_2)_m-$ where m is an integer from 1 to 5.

Preferred polymers P are cellulose ester of acetic acid, propionic acid, butyric acid or of combinations of these acids, as well as polymers based on vinyl alcohol, vinyl acetate and vinyl acetal units.

The reaction of 2-oxazolines with a polymer containing carboxyl-groups is best carried out in solvents in which the carboxyl-groups (containing the polymer) and the end product dissolve well and at reaction temperatures in the range of 90° C. to 160° C. at normal pressure. Preferable solvents may be selected from methyl glycol, ethyl glycol, butyl acetate, sulfolane, 2-ethyl hexanol, methylamyl ketone, ethylamyl ketone, diisobutyl ketone, amyl acetate, 3-methoxy-n-butyl acetate, methyl glycol acetate, ethyl glycol acetate, isopropyl acetate, propyl glycol, butyl glycol and 1-methoxy-propanol-2. The reaction temperature may be reduced to less than 90° C., if a catalyst such as an amine, for example, is added.

The reactions of 2-oxazolines with the carboxyl group containing polymer proceeds in a very controlled and, in most cases, quantitative manner and is therefore easy to reproduce. Thus, the desired acid number of the binder can be adapted exactly to the used photosensitive system as well as to the desired developer.

The starting polymers of the synthesis comprising the carboxyl groups directly bonded to the main chain may comprise acrylic acid, methacrylic acid, itaconic acid or carboxy styrene. Also polymers having terminal carboxyl groups such as carboxyl groups terminated, oligomeric a-methyl styrene as well as polycondensation products from bifunctional acid anhydrides, such as pyrromelithic acid anhydride fall within this group.

This group also includes polymers derived from maleic acid anhydride, copolymers of maleic acid anhydride being used preferably that form an open ring with alcohols having 1 to 8 carbons such as methanol, ethanol, propanol, butanol, pentanol and the like. In some cases, alcohols having unsaturated groups are also advantageous for the preparation of semi-esters of maleic acid anhydride units. Such unsaturated alcohols are preferably allyl alcohol, hydroxy alkyl acrylates or hydroxy alkyl methacrylates.

The most suitable polymers incorporated with the carboxyl group are connected via spacers and preferably include those which were prepared by reacting OH-group containing polymers with intramolecular, cyclic acid anhydrides of dicarboxylic acids. Examples are reaction products of partly or completely saponified polyvinyl acetates, polyvinyl acetates having free OH groups, copolymers of hydroxy alkyl(meth) acrylates, cellulose esters or phenolic resins with: maleic acid anhydride or derivatives thereof (such as dimethylmaleic acid anhydride or citraconic acid anhydride), phthalic acid anhydride or substitution products (such as chloro, nitro or carboxyphthalic acid anhydride), succinic acid anhydride or derivatives thereof (such as methyl succinic acid anhydride), glutaric acid anhydride or derivatives thereof (such as 3-oxaglutaric acid anhydride, 3-methyl glutaric acid anhydride, 3,3-tetramethylene glutaric acid anhydride or camphoric acid anhydride), naphthalene dicarboxylic acid anhydride or its substitution products (such as naphthalene-2,3-dicarboxylic acid anhydride or naphthalene-1,8-dicarboxylic acid anhydride), pyridin-2,3-dicarboxylic acid anhydride or its substitution-products, pyrazin-o-carboxylic acid anhydride or substitution products thereof, furan-o-carboxylic acid anhydride or its substitution products, thiophen-o-carboxylic acid anhydride or thiophen-2,5-dicarboxylic acid anhydride, their substitution products as well as their completely or partially hydrated derivatives or di- or polycyclic anhydrides, which are formed by Diels-Alder-reaction of a diene with maleic acid anhydride (such as addition products of furan, anthracene, cyclohexadiene-1,3, or cyclopentadiene and maleic acid anhydride). Reaction products with maleic, phthalic, succinic and 3-oxaglutaric acid anhydride are more preferred.

The molecular weight of the binders modified with 2-oxazolines may vary over a broad range. Generally the binders have a average molecular weight from 5,000 to 250,000 and more preferably, from 10,000 to 100,000.

The second substantial component of the photosensitive composition of this invention is a photoreactive component selected from a diazonium polycondensation product, or a free radical polymerizable system, consisting of photo initiators and unsaturated compounds, which are free radical polymerizable, or a hybrid system comprising a diazonium polycondensation product and a free radical polymerizable system comprising photo initiators and unsaturated compounds which are free radical polymerizable.

In the photosensitive compositions of the present invention, diazonium polycondensation products, known in the art, can be used. Such condensation products may, for instance, be prepared in a common manner by condensation of a diazo monomer, as described in U.S. Pat. No. 4,687,727, with a condensation agent, such as formaldehyde, acetaldehyde, propionaldehyde, butyraldehyde, isobutyraldehyde or benzaldehyde. Furthermore, mixed condensation products may be used which, apart from the diazonium salt units, comprise other non-photosensitive units which are derived from condensable compounds, such as aromatic amines, phenols, phenol ethers, aromatic thioethers, aromatic hydrocarbons, aromatic heterocycles or organic acid amides. Especially advantageous examples of diazonium polycondensation products are reaction products of diphenylamine-4-diazonium salts, which optionally have a methoxy group as part of the phenyl substituent bearing the diazo group, with formaldehyde or 4,4'-bis-methoxymethyl diphenyl ether. Aromatic sulfonates such as 4-tolylsulfonate or mesitylene sulfonate are particularly suitable as anions of these diazo resins. The diazonium polycondensation product is preferably present in the photosensitive compositions in an amount ranging from 3 to 60 weight %.

The second substantial component may be a free radical polymerizable system made up of photoinitiators that absorb light in the range of 300 to 800 nm, and more preferably in the range of 300 to 450 nm, and a free radical polymerizable component(s). The basic bodies and/or derivatives of acetophenone, benzophenone, (trichloromethyl)-1,3,5-triazine, benzoin, benzoin ethers, benzoin ketals, xanthone, thioxanthone, acridine or hexaryl-bis-imidazole are preferred photoinitiators for the photosensitive composition. The free radical polymerizable component of the composition is an acrylic or methacrylic acid derivative having one or more unsaturated groups, which preferably are esters or amides of acrylic or methacrylic acid in the form of monomers, oligomers or prepolymers and may be present in solid or liquid form, although solid and highly viscous forms are preferred. The compounds suitable as monomers include trimethylol propane triacrylate and methacrylate, pentaerythritol triacrylate and methacrylate, dipentaerythritol-mono hydroxy pentaacrylate and methacrylate, dipenta erythritolhexa-acrylate and methacrylate, pentaerythritol tetraacrylate and methacrylate, ditrimethylol propane tetraacrylate and methacrylate, diethylene glycol diacrylate and methacrylate, triethylene glycol diacrylate and methacrylate or tetraethylene glycol diacrylate and methacrylate. Suitable oligomers and/or prepolymers are urethane acrylate and methacrylate, epoxide acrylate and methacrylate, polyester acrylate and methacrylate, polyester acrylate and methacrylate or unsaturated polyester resins. The photoinitiators and free radical polymerizable components are arranged in a manner known in the art. Combinations of various photoinitiators and free radical polymerizable components are also advantageous. The weight percent of the photoinitiators in composition is preferably from about 0.5 to about 20% and the weight percent of the free radical polymerizable component is preferably from about 5 to about 80%, based on the total solid content of photosensitive composition.

A combination of a diazonium polycondensation product and a free radical polymerizable system having a photoinitiator and unsaturated compound(s), which are free radical polymerizable, may be advantageous for certain applications. The composition of such hybrid system preferably comprise about 1 to about 50 weight % diazonium polycondensation products, about 0.5 to about 20 weight % photoinitiators as well as about 5 to about 80 weight % free radical polymerizable components.

The exposure indicators employed in the photosensitive composition of the invention are known in the art. Exposure indicators from the group of triaryl methane dyes (such as Victoria blue BO, Victoria blue R, crystal violet) or azo dyes (such as 4-phenyl azo diphenylamine, azo benzol or 4-N, N-dimethyl amino azo benzol) are preferred and are present from about 0.02 to about 10 weight %, and more preferably from 0.5 to 6 weight %.

Suitable dyes for improving the contrast of the image are those that dissolve well in the solvent or solvent mixture used for coating or are easily introduced in the disperse form of a pigment. Suitable contrast dyes include inter alia rhodamin dyes, methyl violet, anthrachinone pigments and phthalocyanine dyes and/or pigments.

Furthermore, the photosensitive composition of this invention may comprise stabilizing acids. These stabilizing acids include phosphoric, citric, benzoic m-nitrobenzoic, p-anilino azobenzol sulfonic, p-toluene sulfonic or tartaric acid. In some formulations a mixture of several different acids may be advantageous. Phosphoric acid is the preferred stabilizing acid. The acid is added in preferable amounts of about 0.2 to about 3 weight %.

The photosensitive composition of this invention may also comprise a plasticizer. Suitable softening agents include dibutyl phthalate, triaryl phosphate and dioctyl phthalate. Dioctyl phthalate is especially preferred. The amount of plasticizer used preferably ranges from about 0.25 to about 2 weight %.

The photosensitive composition of this invention is preferable for producing lithographic plates. In addition, it may be used in recording materials for creating images on suitable carriers and as receiving sheets for creating reliefs that may serve as printing molds, screens and the like, and as light-hardening varnishes for surface protection and for formulating UV-hardening printing inks.

For the preparation of planographic printing plates, the aluminum substrate is first roughened by brushing in a dry state, brushing with abrasive suspensions or electrochemically, e.g. in hydrochloric acid electrolyte. The toughened plates, which were optionally anodically oxidized in sulfuric or phosphoric acid, are then subjected to a hydrophilizing aftertreatment, preferably in an aqueous solution of polyvinyl phosphonic acid, sodium silicate or phosphoric acid. The details of the above-mentioned substrate pretreatment are well-known in the art.

The dried plates are then coated with the photosensitive layers in solvents and/or solvent mixtures so that dry layer weights are preferably from about 0.5 to about 4 g/m$^2$, and more preferably from 0.8 to 3 g/m$^2$.

In some cases the additional application of an oxygen-impermeable top layer to the photosensitive layer might be advantageous and is especially advantageous in free radical polymerizable systems and in the hybrid systems of diazonium polycondensation products and free radical polymerizable systems. The polymers suitable for the top layer include polyvinyl alcohol, polyvinyl alcohol/polyvinyl acetate copolymers, polyvinyl pyrrolidone, polyvinyl pyrrolidone/polyvinyl acetate copolymers, polyvinyl methyl ether, polyacrylic acid and gelatine. The thickness of the oxygen-impermeable top layer is preferably about 0.1 to about 4 g/m$^2$, and more preferably 0.3 to 2 g/m$^2$.

Lithographic plates obtained using the photosensitive composition of the present invention are exposed and developed by procedures which are common and known in the art. The developed plates are usually treated with a preservative ("rubber coating") which is typically an aqueous solution of hydrophilic polymers, wetting agents and/or other additives.

For certain uses it may be advantageous to increase the mechanical strength of the printing layer by means of a heat treatment or the combined use of heat and UV radiation. For this purpose, the plate is first treated with a solution that protects the non-image areas so that the heat treatment will cause no ink receptivity in that area. A suitable solution to protect the non-image area is described in U.S. Pat. No. 4,355,096.

The following examples serve to provide a more detailed explanation of the invention and are not intended to limit the scope thereof in any respect and should not be so construed.

PREPARATION EXAMPLE 1

300 9 Scripset 540® (butyl semi-ester of the maleic acid anhydride/styrene copolymers available from Monsanto) are dissolved in 1,500 ml dipropylene glycol dimethyl ether and after adding 45 g 2-phenyl-Δ$^2$-oxazoline stirred for 5 hours at 120° C. under nitrogen atmosphere. After adding hexane, a polymer can be decanted which after dissolution in methanol, precipitation with water and drying for 24 hours at 40° C. has an acid number of 125.

PREPARATION EXAMPLE 2

200 g Scripset 540® are dissolved in 1,000 ml ethylene glycol methyl ether acetate and after adding 21.2 g 2-ethyl-Δ$^2$-oxazoline and 15.7 g 2-phenyl-Δ$^2$-oxazoline stirred for 5 hours at 120° C. under nitrogen atmosphere. After adding hexane, a polymer can be decanted which after dissolution in methanol, precipitation with water and 24 hours drying at 40° C. has an acid number of 115.

PREPARATION EXAMPLE 3

300 g CAP® (cellulose acetate phthalate available from Eastman Kodak) are dissolved in 1,500 ml methyl glycolacetate and after adding 39.5 g 2-phenyl-Δ$^2$-oxazoline stirred for 3 hours at 110° C. under nitrogen atmosphere. After adding hexane, a polymer can be decanted which after dissolution in methanol, precipitation with water and 24 hours drying at 40° C. has an acid number of 72.

PREPARATION EXAMPLE 4

200 g Scripset 540® are dissolved in 1,000 ml dipropylene glycol dimethyl ether and after adding 80 g 2-ethyl-Δ$^2$-oxazoline stirred for 90 minutes at 120° C. under nitrogen atmosphere. After addition of hexane, a polymer can be obtained which after drying for 24 hours at 40° C. has an acid number of 46.

PREPARATION EXAMPLE 5

(Primary Step for Preparation Example 6;
According to European Patent A-0 152 819)

250 g Mowital B60T® (polyvinyl butyral available from HOECHST having an acetal content of 70 weight %, a vinyl alcohol content of 26 weight % and an acetate content of 3 weight %) are dissolved in 5,000 ml methyl ethyl ketone and after adding 200 g maleic acid anhydride and 10 ml triethyl amine stirred for 6 hours at 80° C. Upon precipitation in water, washing the polymer with water and drying for 24 hours at 40° C., the product having the acid number 100 is obtained.

PREPARATION EXAMPLE 6

100 g of the polymer from Preparation Example 5 are dissolved in 2,000 ml methyl ethyl ketone and after adding 18.6 g 2-ethyl-Δ$^2$-oxazoline and 10 ml triethyl amine stirred for 6 hours at 50° C. The polymer is precipitated in water, washed with water and dried for 24 hours at 40° C. The obtained product has an acid number of 52.

PREPARATION EXAMPLE 7

100 g of the polymer from Preparation Example 5 are dissolved in 1,500 ml methyl ethyl ketone and after adding 10.2 g 2-phenyl-Δ$^2$-oxazoline and 10 ml triethyl amine stirred for 6 hours at 70° C. The polymer is precipitated using hexane, the lumpy material is decanted and again dissolved in methanol. The methanolic solution is precipitated in water, the polymer is filtered off and dried for 24 hours at 40° C. The product has an acid number of 77.

PREPARATION EXAMPLE 8

(Primary Step for Preparation Example 9;
According to European Patent A-0 152 819)

125 g Mowital B60T® (polyvinyl butyral available from Hoechst having an acetal content of 70 weight %, a vinyl alcohol content of 26 weight % and an acetate content of 3 weight %) are dissolved in 2,500 ml methyl ethyl ketone and after adding 30 g pyridin-2,3-dicarboxylic acid anhydride and 5 ml triethyl amino stirred for 6 hours at 80° C. Upon precipitation in water, washing the polymer with water and drying for 24 hours at 40° C., a product having the acid number 70 is obtained.

PREPARATION EXAMPLE 9

100 g of the polymer from Preparation Example 8 are dissolved in 2,000 ml methyl ethyl ketone and after adding 6.5 g 2-ethyl-$\Delta^2$-oxazoline and 2 ml triethyl amine stirred for 6 hours at 50° C. The polymer is precipitated in water, washed with water and dried for 24 hours at 40° C. The product has an acid number of 35.

EXAMPLE I

A coating solution is prepared from the components:

| |
|---|
| 6.45 g binder according to Preparation Example 1 |
| 3 g polycondensation product from 1 mole 3-methoxy diphenylamine-4-diazonium sulfate and 1 mole 4,4'-bis-methoxymethyldiphenyl ether precipitated as mesitylene sulfonate |
| 0.5 g Victoria blue (C.I. Solvent Blue 5) |
| 0.05 g phosphoric acid. |

These components are dissolved under stirring in 100 ml of a mixture comprising:

30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The printing layer is exposed under a silver film halftone step wedge having a tonal range of 0.15 to 1.95, wherein the density increments amount to 0.15, to give a negative model using a metal halogenide lamp (MH burner, available from Sack) and an exposure dose of 300 mJ/cm².

The exposed coating is treated for 30 seconds with a developer solution comprising:

3.4 parts by weight Rewopol NLS 28®(REWO)

1.8 parts by weight 2-phenoxy ethanol 1.1 parts by weight diethanol amine 1.0 parts by weight Texapon® 842 (Henkel)

0.6 parts by weight Nekal® BX Paste (BASF)

0.2 parts by weight 4-toluene sulfonic acid 91.9 parts by weight water.

Then the developer solution is again rubbed over the surface for another 30 seconds using a tampon and then the entire plate is rinsed with water. After this treatment the exposed portions remain on the plate. For the assessment of its photosensitivity the plate is blackened in a wet state using a printing ink.

The plate's ink receptivity is good and exposed microscopic lines are very well reproduced.

For the preparation of a lithographic plate a printing layer is applied to the aluminum foil, as explained above, exposed, developed and after rinsing with water the developed plate is wiped and rubbed with an aqueous solution of 0.5% phosphoric acid and 6% gum arabic. The thus prepared plate is loaded in a sheet-fed offset printing machine and under normal printing conditions provided 120,000 copies of good quality. The plate could be used for more prints.

EXAMPLE 2

A coating solution is prepared from the following components:

| |
|---|
| 5.45 g binder according to Preparation Example 2 |
| 4 g polycondensation product from 1 mole 3-methoxy diphenylamine-4-diazonium sulfate and 1 mole 4,4'-bis-methoxymethyldiphenyl ether precipitated as mesitylene sulfonate |
| 0.5 g Victoria blue (C.I. Solvent Blue 5) |
| 0.05 g phosphoric acid. |

These components are dissolved under stirring in 100 ml of a mixture comprising:

30 parts by volume methyl glycol 45 parts by volume methanol 25 parts by volume methyl ethyl ketone. After filtration, the solution is applied to, an electrochemically toughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

EXAMPLE 3

A coating solution is prepared from the following components:

| |
|---|
| 6.95 g binder according to preparation Example 3 |
| 2.5 g polycondensation product from 1 mole 3-methoxy diphenylamine-4-diazonium sulfate and 1 mole 4,4'-bis-methoxymethyldiphenyl ether precipitated as mesitylene sulfonate |
| 0.5 g Victoria blue (C.I. solvent Blue 5) |
| 0.05 g phosphoric acid. |

These Components are dissolved under stirring in 100 ml of a mixture comprising:

30 parts by volume methyl glycol 45 parts by volume methanol 25 parts by volume methyl ethyl ketone.

After filtration the solution is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

EXAMPLE 4

A coating solution is prepared from the following components:

```
5.45 g  binder according to Preparation Example 4
4 g     polycondensation product from 1 mole
        3-methoxy diphenylamine-4-diazonium sulfate
        and 1 mole 4,4'-bis-methoxymethyldiphenyl
        ether precipitated as mesitylene sulfonate
0.5 g   Victoria blue (C.I. solvent Blue 5)
0.05 g  phosphoric acid.
```

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

EXAMPLE 5

A coating solution is prepared from the following components:

```
6.8 g   binder according to Preparation Example 6
2 g     polycondensation product from 1 mole 3-
        methoxy diphenylamine-4-diazonium sulfate
        and mole 4,4'-bis-methoxymethyldiphenyl
        ether precipitated as mesitylene sulfonate
1 g     Renol blue B2G (Cu-phthalocyanine pigment
        preparation comprising polyvinyl butyral
        available from HOECHST)
0.15 g  4-phenyl azo diphenylamine
0.05 g  phosphoric acid.
```

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatmenet using an aqueous solution of sodium silicate by means of common methods and the coating is dried for 4 minutes at 90° C. The weight of the printing layer amounts to approximately 1 g/m².

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

EXAMPLE 6

A coating solution is prepared from the following components:

```
5.55 g  binder according to Preparation Example 2
4 g     polycondensation product from 1 mole
        3-methoxy diphenylamine-4-diazonium sulfate
        and 1 mole 4,4'-bis-methoxymethyldiphenyl
        ether precipitated as mesitylene sulfonate
0.5 g   Victoria blue (C.I. solvent Blue 5)
0.05 g  phosphoric acid.
```

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of sodium silicate by means of common methods and the coating is dried for 4 minutes at 90° C. the weight of the printing layer amounts to approximately 1 g/m².

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

EXAMPLE 7

A coating solution is prepared from the following components:

```
7.45 g  binder according to Preparation Example 4
2 g     polycondensation product from 1 mole
        3-methoxy diphenylamine-4-diazonium sulfate
        and 1 mole 4,4'-bis-methoxymethyldiphenyl
        ether precipitated as mesitylene sulfonate
0.5 g   Victoria blue (C.I. solvent Blue 5)
0.05 g  phosphoric acid.
```

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

EXAMPLE 8

A coating solution is prepared from the following components:

| | |
|---|---|
| 6.8 g | binder according to Preparation Example 7 |
| 2 g | polycondensation product from 1 mole 3-methoxy diphenylamine-4-diazonium sulfate and 1 mole 4,4'-bis-methoxymethyldiphenyl ether precipitated as mesitylene sulfonate |
| 1 g | Renol blue B2G (Cu-phthalocyanine pigment preparation comprising polyvinyl butyral available from Hoechst). |
| 0.15 g | 4-phenyl azo diphenylamine |
| 0.05 g | phosphoric acid. |

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of sodium silicate by means of common methods and the coating is dried for 4 minutes at 90° C. The weight of the printing layer amounts to approximately 1 g/m².

EXAMPLE 9

A coating solution is prepared from the following components:

| | |
|---|---|
| 5.2 g | binder according to Preparation Example 3 |
| 2.88 g | of a 80% methyl ethyl ketone solution of an urethane acrylate prepared by reacting Desmodur N 100° (available from Bayer) comprising hydroxy ethyl acrylate and pentaerythrite triacrylate having a double-bond content of 0.5 double bonds/100 g when all isocyanate groups are completely reacted |
| 1.42 g | dipentaerythritol pentaacrylate |
| 0.165 g | 2-(4-methoxy naphth-1-yl)-4,6-bis-(trichloro-methyl)-s-triazine |
| 0.33 g | polycondensation product from 1 mole 3-methoxy diphenylamine-4-diazonium sulfate and 1 mole 4,4'-bis-methoxymethyldiphenyl ether precipitated as mesitylene sulfonate |
| 0.165 g | Victoria blue (C.I. solvent blue 5) |
| 0.12 g | 4-phenyl azo diphenylamine |
| 0.05 g | phosphoric acid. |

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

Then, an oxygen-impermeable layer of 0.3 g/m² dry layer weight was applied analogously by applying a coating of a solution of the following composition:

| | |
|---|---|
| 50 g | polyvinyl alcohol (Airvol 203 available from Air Products; 12% residual acetyl groups) |
| 270 g | water. |

Drying also took place for 5 minutes at 95° C.

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

EXAMPLE 10

A coating solution is prepared from the following components:

| | |
|---|---|
| 3.54 g | binder according to Preparation Example 2 |
| 4.62 g | of a 80% methyl ethyl ketone solution of an urethane acrylate prepared by reacting Desmodur N 100 ® (available from Bayer) comprising hydroxy ethyl acrylate and pentaerythrite triacrylate having a double-bond content of 0.5 double bonds/100 g when all isocyante groups are completely reacted |
| 0.165 g | 2-(4-methoxy napth-1-yl)-4,6-bis-(trichloro-methyl)-1,3,5-triazine |
| 0.16 g | 4,4'-N-N-diethyl amino benzo phenone |
| 9.19 g | 3-mercapto-1,2,4-triazol |
| 0.12 g | congo red |
| 0.2 g | leuco Crystal Violet. |

These components are dissolved under stirring in 100 ml of a mixture comprising:

35 parts by volume methyl glycol 25 parts by volume methanol 40 parts by volume methyl ethyl ketone.

After filtration, the solution is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1.85 g/m².

EXAMPLE 11

A coating solution is prepared from the following components:

| | |
|---|---|
| 7.45 g | binder according to Preparation Example 1 |
| 2 g | polycondensation product from 1 mole diphenylamine-4-diazonium sulfate and 1 mole formaldehyde precipitated as hexafluorophosphate |
| 0.5 g | Victoria blue (C.I. solvent Blue 5) |
| 0.05 g | phosphoric acid. |

These components are dissolved under stirring in 100 ml of a mixture comprising:

30 parts by volume methyl glycol 45 parts by volume methanol 25 parts by volume methyl ethyl ketone.

After filtration,. the solution is applied to an electrochemically toughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

EXAMPLE 12

A coating solution is prepared from the following components:

---

6.45 g binder according to Preparation Example 9
3 g polycondensation product from 1 mole 3-methoxy diphenylamine-4-diazonium sulfate and 1 mole 4,4'-bis-methoxymethyldiphenyl ether precipitated as mesitylene sulfonate
0.5 g Victoria blue (C.I. solvent Blue 5)
0.05 g phosphoric acid.

---

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically toughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

The plate is exposed, developed, blackened and used for printing as described in Example 1.

The plate's ink receptivity is good and exposed microscopic lines are very well reproduced.

The thus prepared plate is loaded in a sheet-fed offset printing machine and under normal printing conditions provided 100,000 copies of good quality. The plate could be used for more prints.

COMPARATIVE EXAMPLE 1

A coating solution is prepared from the following components:

---

7.45 g Scripset 540 ® (butyl semi-ester of the maleic acid anhydride/styrene copolymer available from Monsanto)
2 g polycondensation product from 1 mole 3-methoxy diphenylamine-4-diazonium sulfate and 1 mole 4,4'-bis-methoxymethyldiphenyl ether precipitated as mesitylene sulfonate
0.5 g Victoria blue (C.I. Solvent blue 5)
0.05 g phosphoric acid.

---

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

The plate is exposed, developed, blackened and used for printing as described in Example 1.

The plate's ink receptivity during manual blackening of the plate is insufficient and exposed microscopic lines are poorly reproduced.

The thus prepared plate is loaded in a sheet-fed offset printing machine. During printing the plate's ink behavior is poor and the ink receptivity of the solids is spotted. Printing 100,000 copies shows clear wear in the solids as well as in the halftone dots.

These results show that the modification of Scripset 540® according to this invention with 2-oxazolines as described in Preparation Examples 1, 2 and 4 and use according to this invention as described in Examples 1, 2, 4, 6 as well as 7 causes a significant improvement of the properties relevant to its use.

COMPARATIVE EXAMPLE 2

A coating solution is prepared from the following components:

---

5.45 g CAP ® (cellulose-acetate/phthalate available from Eastman Kodak)
4 g polycondensation product from 1 mole 3-methoxy diphenylamine-4-diazonium sulfate and 1 mole 4,4'-bis-methoxymethyldiphenyl ether precipitated as mesitylene sulfonate
0.5 g Victoria blue (C.I. Solvent blue 5)
0.05 g phosphoric acid.

---

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

The plate is exposed, developed, blackened and used for printing as described in. Example 1.

The ink receptivity during manual blackening of the plate and the sensitivity are insufficient.

The thus prepared plate is loaded in a sheet-fed offset printing machine. During printing the plate's ink behavior is poor and the ink receptivity of the solids is spotted. Printing 60,000 copies shows clear wear in the solids as well as in the halftone dots.

These results show that the modification of CAP® according to this invention with 2-oxazolines as described in Preparation Example 3 and use according to this invention as described in Example 3 causes a significant improvement of the properties relevant in its use.

COMPARATIVE EXAMPLE 3

A coating solution is prepared from the following components:

---
6.8 g polymer according to Preparation Example 5 (according to U.S. Pat. 4,631,245)
2 g polycondensation product from 1 mole 3-methoxy diphenylamine-4-diazonium sulfate and 1 mole 4,4'-bis-methoxymethyldiphenyl ether precipitated as mesitylene sulfonate
1 g Renol blue B2G (Cu-phthalo cyanine pigment preparation comprising polyvinyl butyral available from HOECHST)
0.15 g 4-phenyl azo diphenylamine
0.05 g phosphoric acid
---

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of sodium silicate by means of common methods and the coating is dried for 4 minutes at 90° C. The weight of the printing layer amounts to approximately 1 g/m².

The plate is exposed, developed, blackened and used for printing as described in Example 1.

The reproduction of fine halftone dots is unsatisfactory.

In Examples 5 and 8, the modification of the polymer of Preparation Example 5 according to this invention with 2-ethyl-$\Delta^2$-oxazoline (Preparation Example 6) or 2-phenyl-$\Delta^2$-oxazoline (Preparation Example 7) shows markedly improved dissolution for fine details.

COMPARATIVE EXAMPLE 4

A coating solution is prepared from the following components:

---
7.45 g Scripset 540 ® (butyl semi-ester of the maleic acid anhydride/styrene copolymer available from Monsanto)
2 g polycondensation product from 1 mole diphenylamine-4-diazonium sulfate and 1 mole formaldehyde precipitated as hexafluorophosphate
0.5 g Victoria blue (C.I. Solvent blue 5)
0.05 g phosphoric acid
---

These components are dissolved under stirring in 100 ml of a mixture comprising:

30 parts by volume methyl glycol 45 parts by volume methanol 25 parts by volume methyl ethyl ketone.

After filtration, the solution is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approximately 1 g/m².

The plate is exposed, developed, blackened and used for printing as described in Example 1.

The thus obtained plate bears only an extremely weak image since the major portion of the layer was removed by the developer. In contrast to Scripset 540® modified according to this invention with 2-phenyl-$\Delta^2$-oxazoline (see Preparation Example 1 and Example 11), printing is impossible with this plate.

What is claimed is:

1. A photosensitive composition comprising:

(a) about 20 to 80 wt %, based on the total weight of the composition, of a binder formed by reacting a carboxyl group containing polymer of the formula $$P\text{---}(X\text{---}COOH)_n \qquad (I),$$

wherein P is a polymer, n is an integer, and X is a single bond or a spacer group;

with a 2-oxazoline of the formula

wherein R is an alkyl, aryl, aralkyl, alkoxy, aryloxy or aralkyloxy group and R' and R" are independently selected from a hydrogen, alkyl or aryl group; in admixture with (b) a photoreactive component, selected from about 3 to 60 wt. % of a diazonium polycondensation product; a free radical polymerizable system consisting of about 0.5 to 20 wt. % of a photoinitiator and about 5 to 80 wt. % of a free radical polymerizable component; or a hybrid photoreactive component consisting of about 1 to 50 wt. % of a diazonium polycondensation product, about 0.5 to 20 wt. % of a photoinitiator and about 5 to 80 wt. % of a free radical polymerizable component; wherein each wt. % is based on the total weight of the photosensitive composition.

2. The photosensitive composition of claim 1 wherein said carboxyl group containing polymer consists of a co-polymer of maleic acid anhydride, ring-opened with a $C_1$–$C_8$ alcohols(s).

3. The photosensitive composition of claim 1 wherein said polymer is selected from cellulose ester of acetic acid, propinoic acid, butyric acid or a combination thereof, or a co-polymer selected from vinyl alcohol, vinyl acetate and vinyl acetal units.

4. The photosensitive composition of claim 1 wherein X is a spacer group of the formula

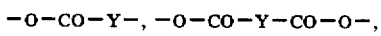

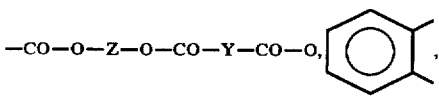

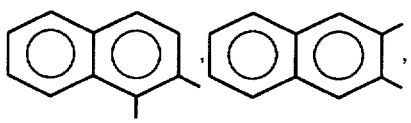

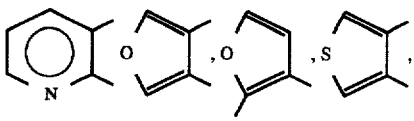

-continued

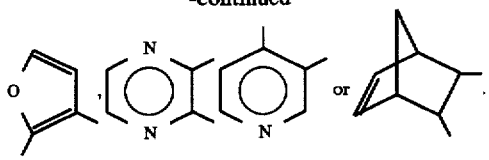

wherein Y is selected from —CR$^1$R$^2$—CR$^3$R$^4$—, —CR$^1$=CR$^2$—, and R$^1$, R$^2$, R$^3$ and R$^4$ are independently selected from hydrogen or an alkyl group and Z is the moiety —(CH2)$_m$—, where m is an integer from 1 to 5.

5. The photosensitive composition of claim 1 wherein said 2-oxazolines used are those where R' and R" are hydrogen and R is a methyl, ethyl or phenyl group.

6. The photosensitive composition of claim 1 wherein said photoreactive component is a diazonium polycondensation product selected from 3-methoxy-diphenylamine-4-diazonium sulfate, 4,4'-bis-methoxymethyl-diphenyl ether precipitated from aqueous solution as organic sulfonate, tetrafluoroborate, hexafluorophosphate, hexafluoroantimonate or hexafluoroarsenate.

7. The photosensitive composition of claim 1 wherein said photoinitiator is sensitive to light having a wavelength ranging from about 300 to about 800 nm.

8. The photosensitive composition of claim 1 wherein said carboxyl group containing polymer is present in a molar concentration of from about 5 to about 100 mole percent.

9. The photosensitive composition of claim 1 comprising an exposure indicator.

10. The photosensitive composition of claim 1 comprising a dye.

11. The photosensitive composition of claim 1 comprising an acid.

12. A lithographic printing plate coated with the photosensitive composition of claim 1.

13. The lithographic printing plate of claim 12 further comprising an overcoat layer.

* * * * *